United States Patent
Yamada

[11] Patent Number: 5,910,020
[45] Date of Patent: Jun. 8, 1999

[54] METHOD FOR FABRICATING A SEMICONDUCTOR DEVICE HAVING A REFRACTORY METAL PILLAR FOR ELECTRICAL CONNECTION

[75] Inventor: Yoshiaki Yamada, Tokyo, Japan

[73] Assignee: NEC Corporation, Japan

[21] Appl. No.: 08/769,162

[22] Filed: Dec. 18, 1996

[30] Foreign Application Priority Data

Dec. 18, 1995 [JP] Japan ................................. 7-329303

[51] Int. Cl.⁶ .......................... H01L 21/28; H01L 21/311
[52] U.S. Cl. ...................... 438/624; 438/633; 438/634; 438/637; 438/648
[58] Field of Search .................... 438/622, 623, 438/624, 631, 633, 634, 637, 648, 656; 257/752, 758, 759, 760, 763

[56] References Cited

U.S. PATENT DOCUMENTS

| | | | |
|---|---|---|---|
| 5,229,326 | 7/1993 | Dennison et al. ................ | 438/586 |
| 5,286,675 | 2/1994 | Chen et al. ...................... | 438/624 |
| 5,429,995 | 7/1995 | Nishiyama et al. .............. | 438/622 |
| 5,612,254 | 3/1997 | Mu et al. ......................... | 438/634 |
| 5,736,457 | 4/1998 | Zhao ................................ | 438/624 |

FOREIGN PATENT DOCUMENTS 7-99198  4/1995  Japan .
7-147329  6/1995  Japan .

OTHER PUBLICATIONS

Wolf, S., Silicon Processing for the VLSI Era, vol. 2, 1990, Lattice Press, pp. 192–194, 245–253, 279–283.

Primary Examiner—T. N. Quach
Attorney, Agent, or Firm—Hayes, Soloway, Hennessey, Grossman & Hage, P.C.

[57] ABSTRACT

Disclosed is a method for fabricating a semiconductor device which prevents generation of imperfections in an aluminum alloy as an upper wiring even when part of a refractory metal pillar, which fills in a contact hole connecting lower and upper wiring layers, is exposed due to displacement of the upper wiring layer. The method comprises forming a third insulation film, a second insulation film and a second wiring layer, on a first wiring layer, forming holes which extend to the first wiring layer therethrough, forming refractory metal pillars by filling in the holes with a refractory metals, and forming a fourth insulation film. The second wiring layer is formed within a groove formed by removing the third and fourth insulation films to expose top and side surfaces of the refractory metal pillar. Even when displacement is caused between the refractory metal pillar and the second wiring layer, the reliability does not decrease, since the refractory metal pillars are covered with the fourth insulation film. The second wiring layer is preferably formed by polishing.

22 Claims, 8 Drawing Sheets

METHOD FOR FABRICATING A SEMICONDUCTOR DEVICE HAVING A REFRACTORY METAL PILLAR FOR ELECTRICAL CONNECTION

BACKGROUND OF THE INVENTION

1. Field of the Invention

The present invention relates to a method for fabricating a semiconductor device, and more particularly to a method of fabricating a semiconductor device which comprises a high-melting point refractory metal pillar to connect between a device element and a wiring or between wirings.

2. Description of the Related Art

In conventional semiconductor devices, contact holes for connecting between the semiconductor device elements and the wirings, and via holes for mutual connection between upper and lower wirings are designed with the widths of the wirings larger than the diameters of those contact holes and via holes in consideration of misalignment displacement between the devices and the wirings, or between the wirings, so that the wirings do not miss the holes due to the wide margin even when such displacement is caused, thereby ensuring electrical connection. However, with the increase in the degree of integration of semiconductor devices, the contact holes and via holes have become more and more minuscule, and the above-mentioned displacement margin, i.e., the difference in size of the holes and the wirings is being diminished accordingly, and is recently closing in to almost zero.

In addition, although the diameters of the contact holes and the via holes have been reduced, their depths remain unchanged, and this naturally results in increased aspect ratios (the dept/diameter ratios of the holes) which cause poor coverage with aluminum formed by the conventional sputtering methods. As a result, the problem has arisen that the connection resistance is increased and the wirings tend to be disconnected. For these reasons, it is presently usual to fill in such holes with tungsten (W) formed by chemical vapor deposition (CVD) which exhibits excellent covering properties. When no positioning margins are provided between the holes and the wirings, and when the holes are filled in with tungsten pillars, however, the areas of connection between the tungsten and the wirings are reduced if displacement is caused during formation of the upper wirings. This leads to increased connection resistance, as well as an additional problem of increased tendency for the connection resistance to increase due to electro-migration. These problems are described in, for example, in an article titled "The Dependence of Electromigration Endurance on Contact Area in W-Viahole", Abstract No. 19a-ZD-4, in Extended Abstracts (The Autumn Meeting, 1994) of the Japan Society of Applied Physics.

Therefore, in order to reduce the connection resistance between the hole-filling tungsten pillars and the upper wirings, it has been suggested to provide the tungsten pillars with portions protruding above the holes to obtain additional connections with the sides of the tungsten pillars to thereby lower the resistance (see for example, Japanese Unexamined Patent Application Disclosure (KOKAI) HEI 5-311394). With such a structure in which the tungsten pillars protrude through the holes, the heights of the protrusions of the tungsten pillars through the holes must be appropriately controlled. As a method for the control, there has been suggested a method in which: an interlayer insulation film is first formed of two insulation films with different etch rates, a hole is made through the films, the hole is filled in with a conductor, and the upper insulation film is etched off under such conditions that the etch rate of the upper insulation film is higher than the etch rate of the lower insulation film (see, for example Japanese Unexamined Patent Application Disclosure (KOKAI) HEI 5-318939).

An example of the formation of such a contact hole will now be described with reference to FIG. 7. First, as illustrated in FIG. 7(a), a silicon oxide film 32 and a silicon nitride film 33 are successively formed on a device-formed silicon substrate 31 by CVD. The film thickness of the silicon oxide film 32 is set to a necessary amount to provide insulation between the silicon substrate 31 and the wiring layer, and the film thickness of the silicon nitride film 33 is set to be the same as the height of protrusion of the conductor pillar through the contact hole. A contact hole which extends to the silicon substrate 31 is then made through the silicon nitride film 33 and the silicon oxide film 32 by conventional lithography and reactive ion etching. Thereafter, titanium 34 and titanium nitride 35 are successively laminated by sputtering, and then, tungsten 36 is grown by low pressure chemical vapor deposition (LPCVD) to a film thickness greater than or equal to the radius of the contact hole so as to fill in the contact hole with the tungsten.

Then, as illustrated in FIG. 7(b), the entire surface of the tungsten 36 is etched by reactive ion etching until the titanium nitride 35 is exposed, and the entire surfaces of the titanium nitride 35 and the titanium 34 are then etched by reactive ion etching as well until the silicon nitride film 33 is exposed, thereby forming a pillar of tungsten 36 left only in the contact hole.

The silicon nitride film 33 is then removed by plasma etching so that the pillar of the tungsten 36 protrudes through the contact hole, as illustrated in FIG. 7(c). The height of the protrusion of the pillar of the tungsten 36 through the contact hole is made to be the same as the thickness of the silicon nitride film 33.

Thereafter, as illustrated in FIG. 7(d), an aluminum alloy 37 is formed by sputtering, and the aluminum alloy 37 is then patterned into a desired configuration by conventional lithography and dry etching, to form an aluminum wiring. With the configuration of the contact hole made in this way, therefore, the connection with the aluminum alloy is ensured at both the top surface of the pillar of the tungsten 36 and the side of the protrusion to thereby prevent increase in the electrical resistance.

However, when the positioning margin between the contact hole and the aluminum wiring is small, the displacement causes exposure of some portions of the tungsten 36. This has presented the following problems. A first problem is that the exposure of the tungsten causes generation of defects in portions of the aluminum alloy located near the exposed portions of the tungsten, and thus reliability of the device is decreased. This is because aluminum and tungsten have different ionization tendencies, thus causing the aluminum to be dissolved due to a local battery cell effect generated during water rinsing procedures after the aluminum alloy has been etched.

A second problem involves difficulties associated with planarization of the interlayer insulation film formed on the aluminum wiring and difficulty in establishing connection through the via hole penetrating the interlayer insulation film. This is because the wiring layer on the contact hole section is elevated by the height of the protrusion through the contact hole making it difficult to form a flat interlayer insulation film 38 overlying the entire wiring layer, particularly when two or more contact holes are located close to each other under the wiring layer, as illustrated in FIG. 8(a), in which case a cavity is formed between the wirings causing the reliability of the device to decrease. In addition, since planarization of the interlayer insulation film 38 results in the portion of the interlayer insulation film 38 other than the portion over the contact hole to have a greater thickness, corresponding to the height of the tungsten pillar 36 protrusion than required, that a via hole formed on such a portion has a correspondingly increased depth than actually necessary.

SUMMARY OF THE INVENTION

It is therefore an object of the present invention to provide a method of fabricating a semiconductor device which allows minimization of the connection resistance and prevents decrease in reliability due to defect generation in the aluminum wiring, even when a contact/via hole filling refractory metal pillar extend uncovered from under the wiring due to a smaller margin between the contact/via hole-wiring alignment. It is another object of the present invention to allow easier planarization of the interlayer insulation film formed on the wiring, and to provide a constant depth for via holes provided through the interlayer insulation film to thereby ensure electrical connection through the via hole.

A fabrication method according to the present invention comprises the steps of: forming a first insulation film as a interlayer insulation film on a first wiring layer which is a device element or a lower wiring; forming a second insulation film on the first insulation film; forming a third insulation film on the second insulation film; forming a hole through the first, second and third insulation films to expose the first wiring layer at its bottom; forming a refractory metal pillar structure by filling in the hole with a refractory metal; forming a fourth insulation film to cover exposed surfaces of the pillar structure and the third insulation film; selectively etching off portions of the third and fourth insulation films to form an opening exposing a side and a top surface of the refractory metal pillar structure in an area for formation of a second wiring layer; and filling in the opening with a wiring metal to form a second wiring layer electrically connected with the refractory metal pillar.

Alternatively, another fabrication method according to the present invention comprises the steps of: forming a first insulation film as a interlayer insulation film on a first wiring layer which is a device element or a lower wiring; forming a second insulation film on the first insulation film; forming a hole through the first and second insulation films to expose the first wiring layer at its bottom; forming a refractory metal pillar structure by falling in the hole with a refractory metal; forming a third insulation film cover exposed surfaces of the pillar structure and the second insulation film; selectively etching off portions of the second and third insulation films to form an opening exposing a side and a top surface of the refractory metal pillar structure in an area for formation of a second wiring layer; and filling in the opening with a wiring metal to form the second wiring layer electrically connected with the refractory metal pillar.

Here, in all the fabrication methods mentioned above, it is preferred that the third insulation film has a higher etch rate than the second insulation film so that the second insulation film may be used as an etching stopper film when the third insulation film is selectively etched. The second wiring layer may be formed only in the opening by polishing (planarizing) or etching back the deposited wiring layer. The opening itself may be a groove or a channel or any other equivalent structure suitable to form a wiring layer in electrical contact with the refractory metal pillar structure.

As described above, even if the pillars are exposed from under the wirings due to displacement, since the contact hole and the via hole are filled in with pillars of a refractory metal such as tungsten, titanium or their alloys that protrude from the interlayer insulation films, and an opening filled in with a wiring metal for upper wirings are formed in another interlayer insulation film formed on the former interlayer insulation film, the connection resistance is made low due to additional connections of the wirings with the sides of the refractory metal pillars. Further, even when the wiring metal is formed of an aluminum alloy, no defects are produced therein, since the extruded portions of the refractory metal pillars are covered with the fourth or third insulation film. In addition, since the wirings are planarized, interlayer insulation films are easily formed thereon, and since the thickness of the interlayer insulation film is constant, the via hole made therein has a constant depth, ensuring stable connection through the via hole. Additionally, the amount of protrusions of refractory metal pillars may be easily made uniform by providing the etch rates of the insulation films covering the refractory metal pillars and the portions of the insulation films above which the pillars should extend to be higher than that of the layer underneath.

BRIEF DESCRIPTION OF THE DRAWINGS

The above and other objects, advantages and features of the present invention will be more apparent from the following description taken in conjunction with the accompanying drawing in which.

DETAILED DESCRIPTION OF THE PREFERRED EMBODIMENTS

Figure 1A:
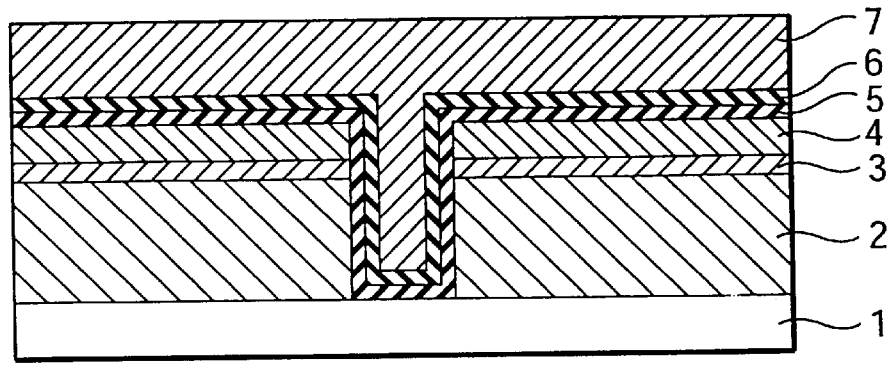
FIG. 1(a)–FIG. 1(c) is a first group of cross-sectional views illustrative of a first embodiment of the present invention, in order of the fabrication steps.

Embodiments of the present invention will now be described with reference to the the process charts in FIG. 1(a)–FIG. 1(c) and FIG. 2(a)–FIG. 2(c) are cross-sectional views illustrative of a first embodiment of the present invention. First, as illustrated in FIG. 1(a), a first silicon oxide film 2, a silicon nitride film 3 and a second silicon oxide film 4 are successively formed on a device-forming silicon substrate 1. The first silicon oxide film 2 has a film thickness necessary to provide isolation between the device and the wiring to be formed and to cover the steps formed by previous fabrication steps of the device, etc., on the order of 1.5 µm, for example, and is formed of a film of boron-phospho-silicate glass (BPSO). The silicon nitride film 3 is designed to have as small a film thickness as 10–30 nm. The film thickness of the second silicon oxide film 4 is designed to be 0.1–0.4 µm, approximately ⅓ to ⅔ times the thickness of the wiring layer.

The second silicon oxide film 4, the silicon nitride film 3 and the first silicon oxide film 2 are then etched selectively by conventional lithography and reactive ion etching to make a contact hole which extends down to the silicon substrate 1. The diameter of the contact hole is designed to be 0.3–0.4 µm. Titanium 5 and titanium nitride 6 are then laminated to thicknesses on the order of 80–120 nm and 100 nm, respectively, by collimated sputtering. Collimated sputtering is a process capable of enhanced coverage on the bottom of a contact hole wherein, only sputtering particles incident on the substrate in directions almost perpendicular thereto are passed through a porous collimator plate provided between the target and the substrate. Subsequently, the composite is annealed in an atmosphere of nitrogen at a temperature of 600–700° C. and then, a tungsten film 7 is grown to a thickness of 0.4–0.6 µm by LPCVD. Though not illustrated in the drawing, the thermal processing results in formation of titanium silicide on the bottom of the contact hole, thereby lowering the connection resistance of the contact hole and increasing the barrier properties of the titanium nitride 6.

Figure 1B:
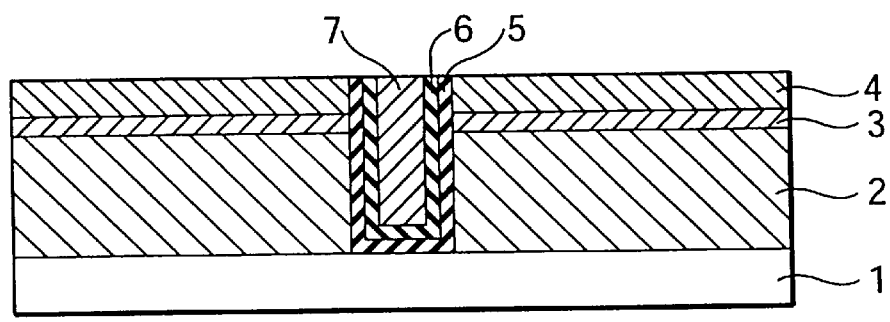

Thereafter, as illustrated in FIG. 1(b), the tungsten film 7 is etched off by dry etching with $SF_6$ gas until the titanium nitride 6 is exposed, and after this the titanium nitride 6 and the titanium 5 are etched with chlorine gas until the surface of the silicon oxide film 4 is exposed.

Figure 1C:
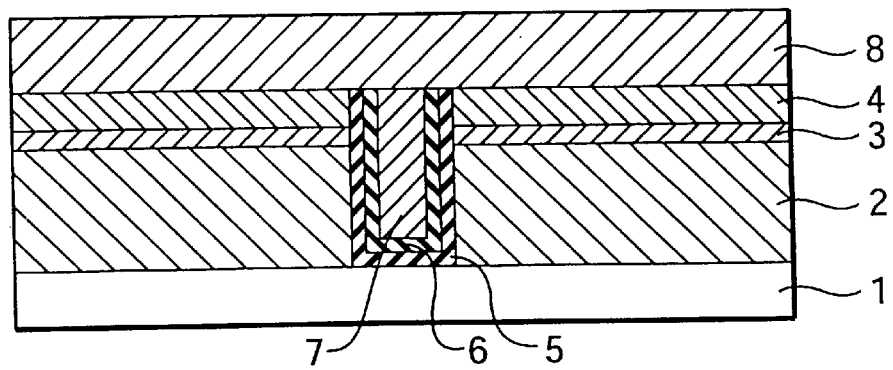

As illustrated in FIG. 1(c), a third silicon oxide film 8 is then formed by CVD. Here, the thickness of the third silicon oxide film 8 is set so that the total film thicknesses of the second silicon oxide film 4 and the third silicon oxide film is the same as the film thickness of the wiring layer which is to be formed in a later step.

Figure 2A:
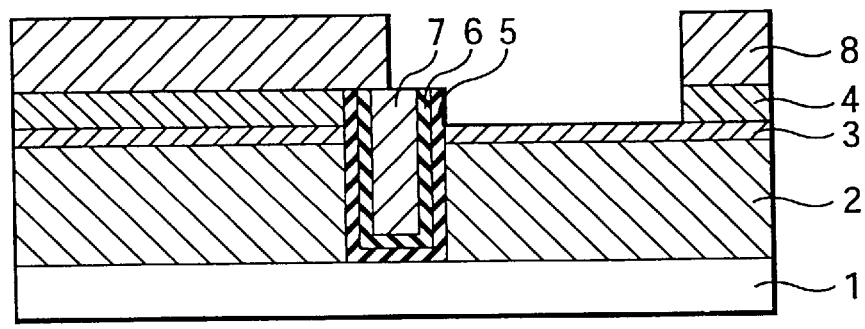
FIG. 2(a)–FIG. 2(c) is a second group of cross-sectional views illustrative of the first embodiment of the present invention, in succession to the fabrication steps shown in FIG. 1(a)–FIG. 1(c)

Then as illustrated in FIG. 2(a), the third silicon oxide film 8 and the second silicon oxide film 4 are subjected to selective etching to form a groove in the area for forming the second wiring. Here, the etching of the third silicon oxide film 8 is performed with a photoresist film lithographically defined as an etching mask, and using a mixed gas of $C_3F_8$, CO, Ar and $O_2$. Here, the flow rates are set to 5–15 sccm for $C_3F_8$, 150–250 sccm for CO, 100–200 sccm for Ar, and a few sccm for $O_2$, while the pressure is set to 30–60 mtorr. When the flow rate of CO is increased, the silicon nitride film 3 is scarcely etched, so the depth of the groove and the height of the tungsten 7 protruding through the silicon nitride film 3 is kept constant even when over-etching is performed. The film thickness of the silicon nitride film 3 is desired to be 10 nm or more for it to act as an etching stopper, and to be 30 nm or less since the wiring capacitance increases when the film thickness is greater.

Figure 2B:
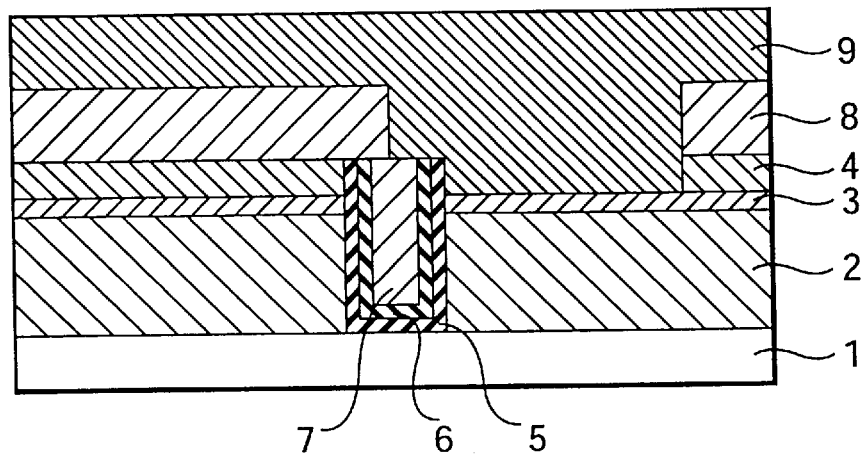
Figure 2C:
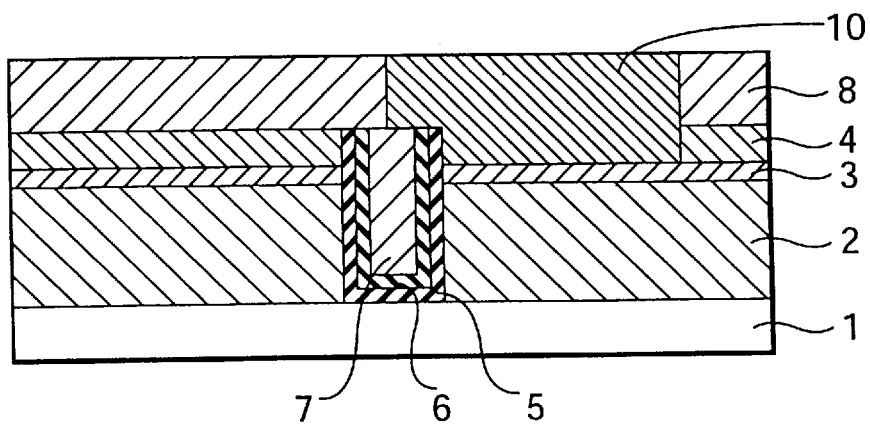

Thereafter, as illustrated in FIG. 2(b), an aluminum alloy film 9 is formed by high-temperature sputtering to fill in the groove. Here, though not illustrated in the drawing, titanium is layered to a thickness on the order of 10–30 nm prior to the sputtering of the aluminum alloy 9, to facilitate the flow of the aluminum alloy 9. The aluminum alloy film 9 is first layered to a thickness on the order of 0.1–0.2 µm at a low temperature of 100° C. or less, and then an additional thickness of 0.5–1.5 µm is provided under lower growth rate conditions set up by provision of lowered sputtering power, at a temperature on the order of 350–450° C., to fill in the groove for wiring. The aluminum alloy 9 is then polished by chemo-mechanical polishing (CMP) until the surface of the silicon oxide film 8 is exposed. The polishing of the aluminum alloy 9 may be accomplished using particles of silica as an abrasive.

The film thickness of the second silicon oxide film 4 is desired to be approximately ⅓ to ⅔ times the thickness of the wiring layer, since at ratios of ⅓ or less, the problem arises that an area of contact between the tungsten pillar and the aluminum alloy is not very large, thus the connection resistance cannot be much reduced, and therefore the effect is small. Whereas at ratios of ⅔ or more, another problem arises that the tungsten pillar may be exposed during the polishing of the aluminum alloy 9. Such exposure of the tungsten pillar results in increase in the connection resistance which causes elution of the aluminum alloy due to a local cell effect to thereby produce imperfections in the aluminum alloy.

According to the first embodiments described above, since the thin silicon nitride film 3 is formed to act as an etching stopper layer against the etching of the silicon oxide film 4, and since the silicon oxide film 4 has a film thickness equal to the height of the protrusion of the tungsten pillar which connects the aluminum wiring 10 and the silicon substrate 1, the amount of protrusion of the tungsten pillar may be uniformly controlled throughout the extension of the silicon substrate 1 by controlling the growth thickness of the silicon oxide film 4.

In addition, since the etching of the groove for the aluminum wiring 10 is stopped by the thin silicon nitride film 3 which exhibits an etch rate lower than the silicon nitride film 3 and the silicon oxide film 4, the depth of the groove automatically matches the total thicknesses of the silicon oxide film 4 and the silicon oxide film 8. Thus the groove depth is easily controlled with increased uniformity throughout the extension of the silicon substrate 1 by controlling the growth of the silicon oxide film 8.

Further in addition, since the aluminum wiring 10 is formed by polishing the aluminum alloy 9, it is not subjected to dry etching, and since the section of connection between the tungsten 7 and the aluminum alloy 9 is not exposed due to the coverage with the fourth insulation film, there is no possibility of the aluminum alloy 9 to be eroded by a local cell effect by water rinsing or the like. Furthermore, since the interlayer insulation film has a planar surface after the formation of the wiring, it is easy to form an upper wiring thereon.

Figure 3A:
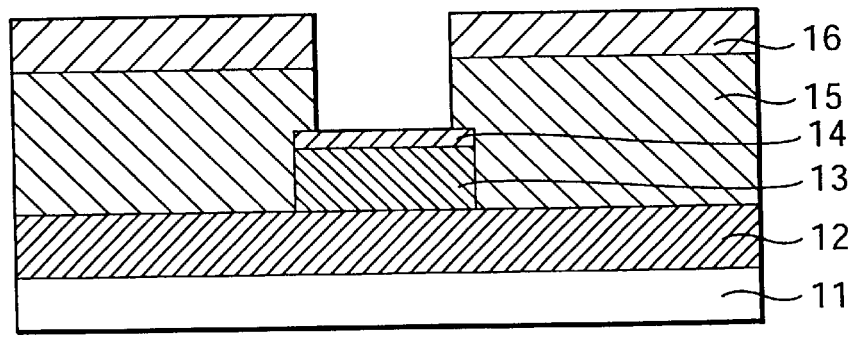
FIG. 3(a)–FIG. 3(c) is a first group of cross-sectional views illustrative of a second embodiment of the present invention, in order of the fabrication steps.

A second embodiment of the present invention will now be described with reference to the process charts in FIG. 3(a)–FIG. 3(c) and FIG. 4(a)–FIG. 4(c). According to this embodiment, a two-layer wiring is formed. First, as illustrated in FIG. 3(a), a first aluminum wiring of a laminated structure which comprises an aluminum alloy 13 and tungsten 14 is formed on a silicon oxide film 12 which covers the surface of a device-forming silicon substrate 11. The aluminum alloy 13 and the tungsten 14 are laminated by sputtering to the thicknesses of approximately 0.4–1.0 µm and 50–200 nm, respectively. Then, after a silicon oxide film 15 and a silicon nitride film 16 have been formed, a connecting hole, which extends in depth to reach the tungsten 14, is formed through the silicon oxide film 15 and the silicon nitride film 16.

Here, the silicon oxide film 15 is formed with as large a thickness as approximately 2 μm, and then polished by CMP to obtain an even surface, the thickness is designed to be on the order of 0.6–1.5 μm after polishing so that the thickness of the film on the first aluminum wiring ensures electrical insulation between the wirings and does not increase the wiring capacity. The silicon nitride film 16 is formed by plasma enhanced CVD to a thickness on the order of 0.2–0.5 μm, ⅓–⅔ times the film thickness of a second aluminum wiring.

Figure 3B:
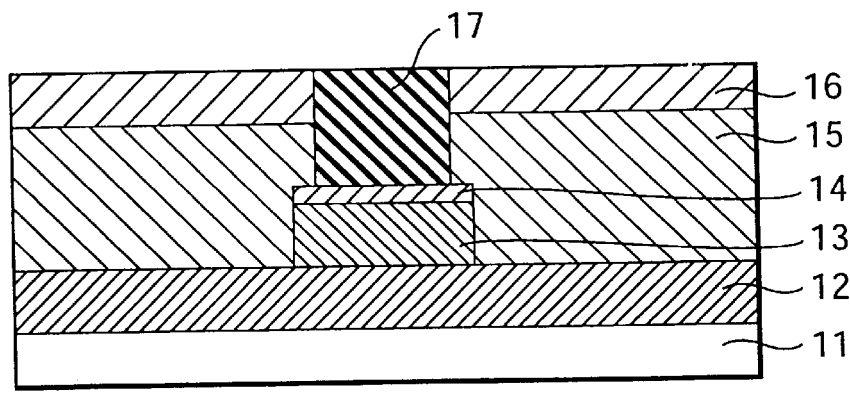
Figure 3C:
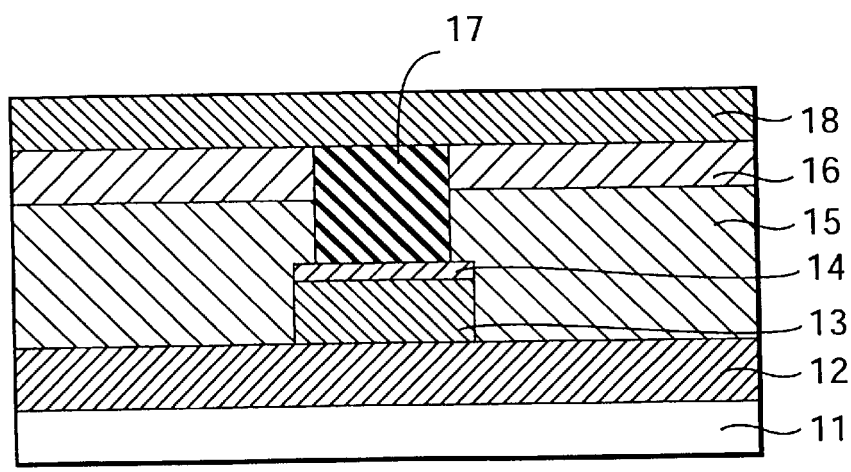

Subsequently, as illustrated in FIG. 3(b), tungsten 17 is selectively grown only on the tungsten 14 by a CVD process which involves reduction of $WF_6$ gas with silane ($SiH_4$). The growth temperature is set at 200–250° C., and the pressure at 10–100 mtorr. Then, as illustrated in FIG. 3(c), a silicon oxide, film 18 is formed by CVD. The film thickness of the silicon oxide film 18 is set so that the total thicknesses of the silicon nitride film 16 and the silicon oxide film 18 will equal the thickness of the second aluminum wiring yet to be formed.

Figure 4A:
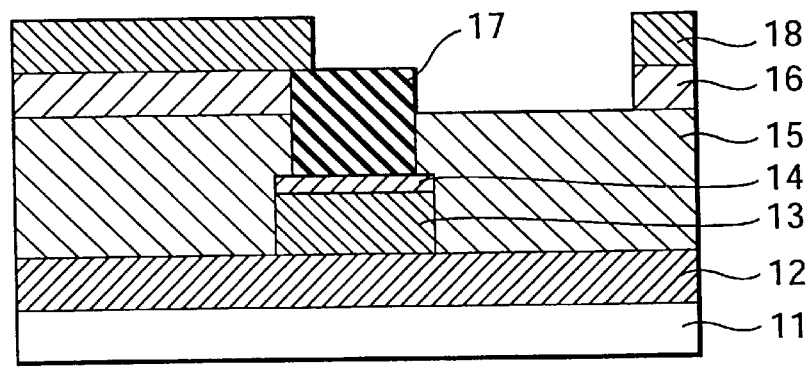
FIG. 4(a)–FIG. 4(c) is a second group of cross-sectional views illustrative of the second embodiment of the present invention, in succession to the fabrication steps shown in FIG. 3(a)–FIG. 3(c)

Then, as illustrated in FIG. 4(a), the silicon oxide film 18 and the silicon nitride film 16 are etched off using a photoresist film as an etching mask, to form a groove for formation of the second aluminum wiring. The etching of the silicon oxide film 18 may be accomplished selectively, i.e., without substantially etching the silicon nitride film 16, through selection of a proper mixing ratio of the etching gases, $CHF_3$ and CO. The silicon nitride film 14 is then etched with $NH_3$ which is supplied in place of CO. Here, selection of a proper mixing ratio of $CHF_3$ and $NH_3$ allows etching of the silicon nitride film 14 alone while etching the silicon oxide film 15 very little.

Figure 4B:
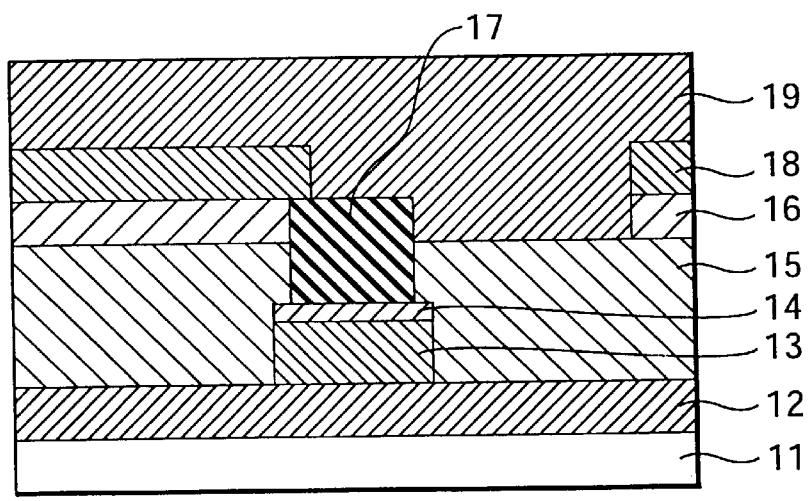
Figure 4C:
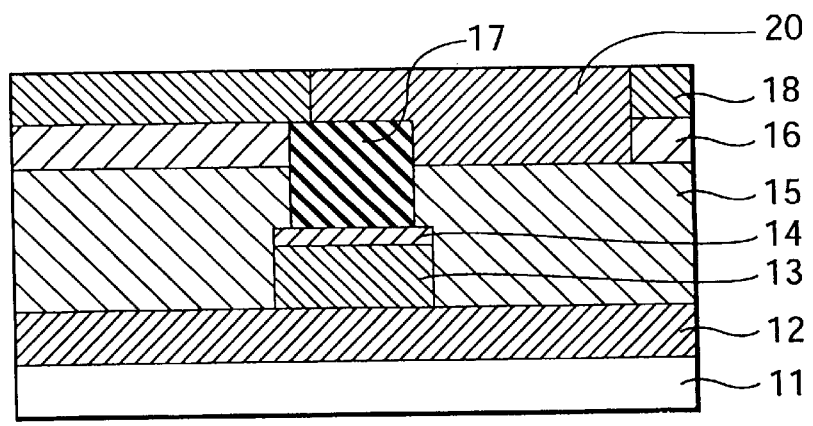

Then, as illustrated in FIG. 4(b), likewise according to the first embodiment, an aluminum alloy 19 is formed by high-temperature sputtering to fill in the groove for the second aluminum wiring. The aluminum alloy 19 is then polished by CMP until the surface of the silicon oxide film 18 is exposed, thus forming the second aluminum wiring 20, as illustrated in FIG. 4(c).

According to the second embodiment, since the silicon nitride film 16 has a film thickness greater then the silicon nitride film 3 according to the first embodiment, the wiring capacity is slightly increased. However, the second embodiment has the advantage of lower manufacturing cost, because the number of CVD steps for forming the insulation films is one less than the number required in the first embodiment, and thus the total number of process steps may be reduced.

A third embodiment of the present invention will now be described with to reference to the process charts in FIG. 5(a)–FIG. 5(c) and FIG. 6(a)–FIG. 6(c). The present embodiment is basically the same as the second embodiment, except that a silicon oxy-fluoride film 21 is used instead of the silicon nitride film 16.

Figure 5A:
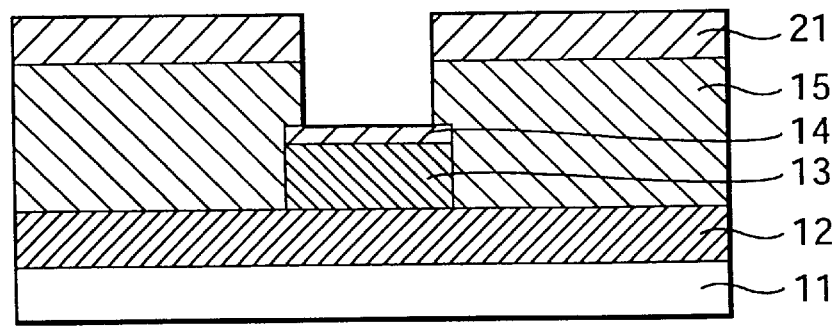
FIG. 5(a)–FIG. 5(c) is a first group of cross-sectional views illustrative of a third embodiment of the present invention, in order of the fabrication steps.
Figure 5B:
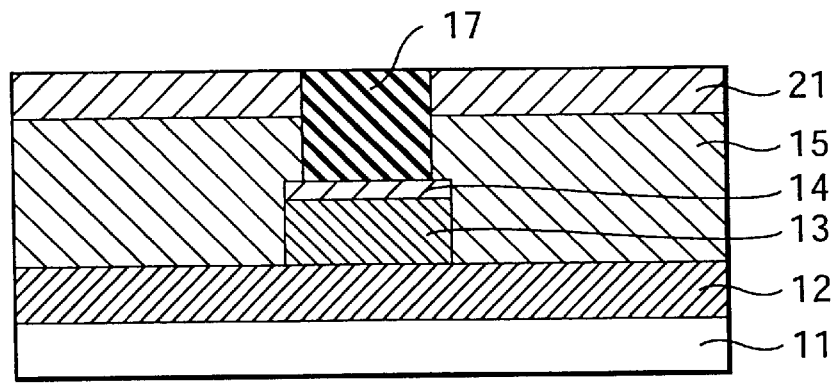
Figure 5C:
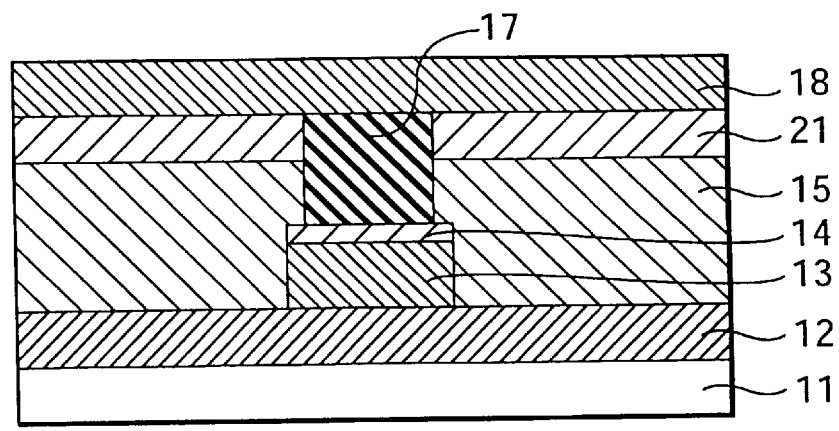

More specifically, as illustrated in FIG. 5(a), likewise according to the second embodiment, the silicon oxide film 15 and the silicon oxy-fluoride film 21 are successively formed on the first aluminum wiring comprising an aluminum alloy film 13 and tungsten film 14, and a connecting hole which has a depth reaching the first aluminum wiring is formed through the silicon oxide film 15 and the silicon oxy-fluoride film 21. Then, as illustrated in FIG. 5(b), tungsten 17 is selectively grown on the tungsten film 14 by LPCVD using $WF_6$ and $SiH_4$, to fill in the connecting hole. A silicon oxide film 18 is then formed by CVD, as illustrated in FIG. 5(c).

Figure 6A:
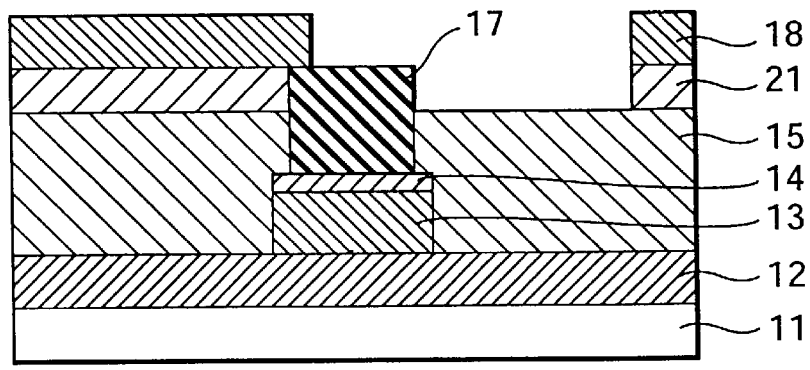
FIG. 6(a)–FIG. 6(c) is a second group of cross-sectional views illustrative of the third embodiment of the present invention, in succession to the fabrication steps shown in FIG. 5(a)–FIG. 5(c)

Thereafter, as illustrated in FIG. 6(a), the silicon oxide film 18 and the silicon oxy-fluoride film 21 are etched using a photo resist film (not shown) as a mask, to form a groove for the second aluminum wiring. Here, after the silicon oxide film 18 has been etched with a gas of $CH_3$ and CO, the flow rate of $CHF_3$ is decreased to etch the silicon oxy-fluoride film 21. This is because, since the silicon oxy-fluoride film 21 contains fluorine, the etching may be accomplished at a lower flow rate of $CHF_3$ than the etching of the silicon oxide film 18. Assuming that the concentration of fluorine in the silicon oxy-fluoride film 21 is on the order of 10%, for example, a typical groove may be etched without substantially etching the silicon oxide film 15, by setting the flow rate of $CHF_3$ to be 10% or less of the total flow rate of $CHF_3$ and CO.

Figure 6B:
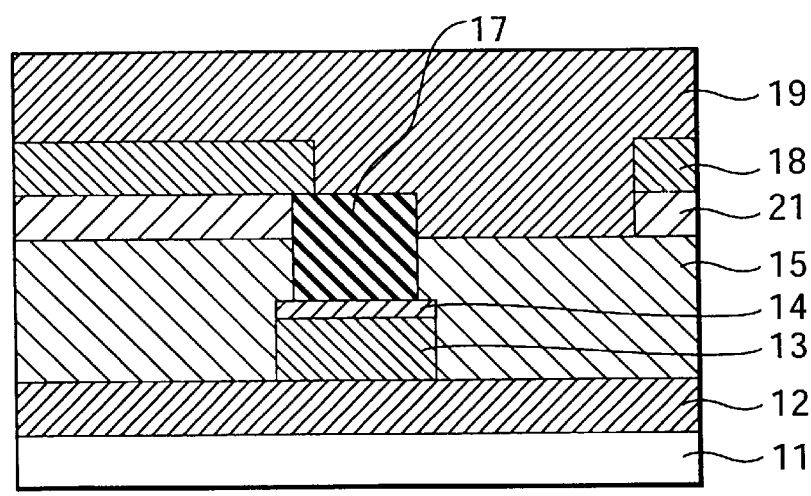
Figure 6C:
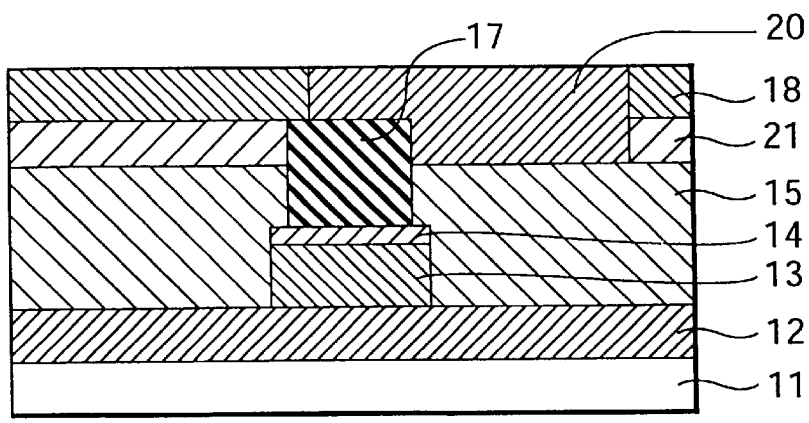
Figure 7A:
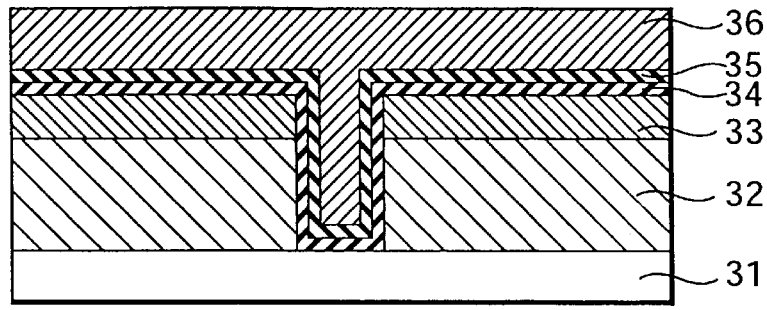
FIG. 7(a)–FIG. 7(d) is a group of cross-sectional views illustrative of a conventional fabricating method, in order of the fabrication steps; and FIG. 8(a)
Figure 7B:
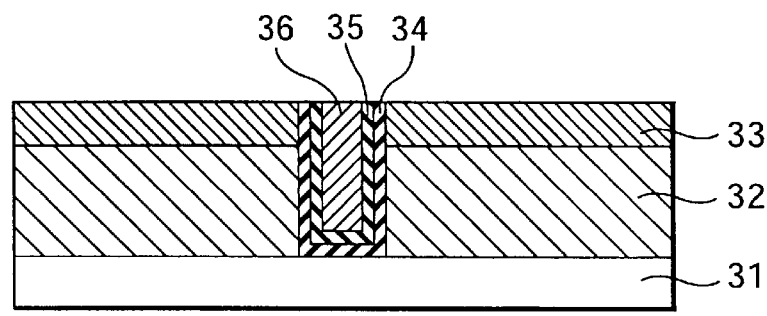
Figure 7C:
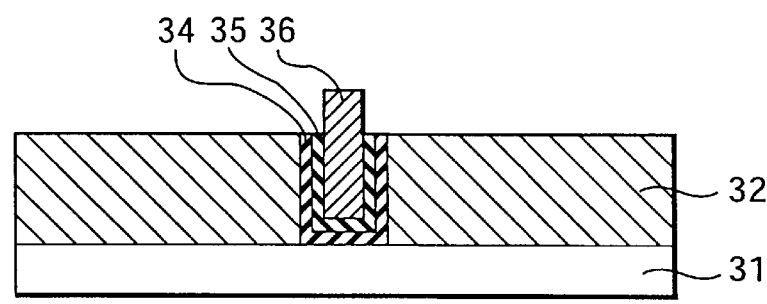
Figure 7D:
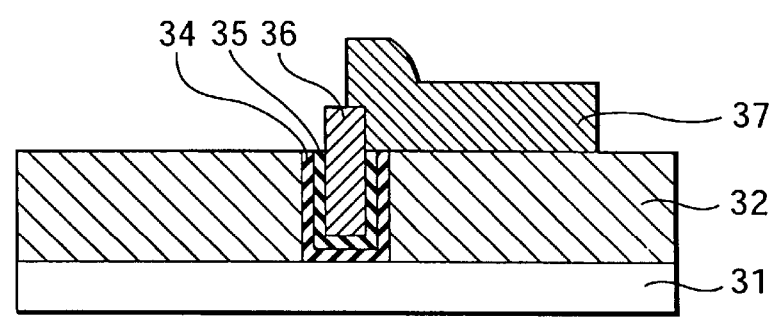
Figure 8A:
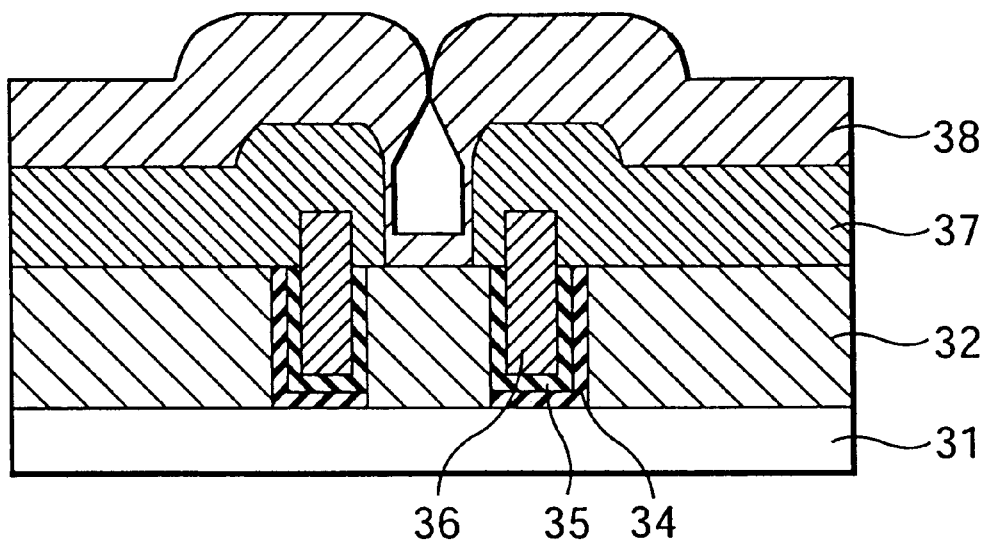
–FIG. 8(b) is a group of cross-sectional views illustrative of problems of the conventional fabrication method.
Figure 8B:
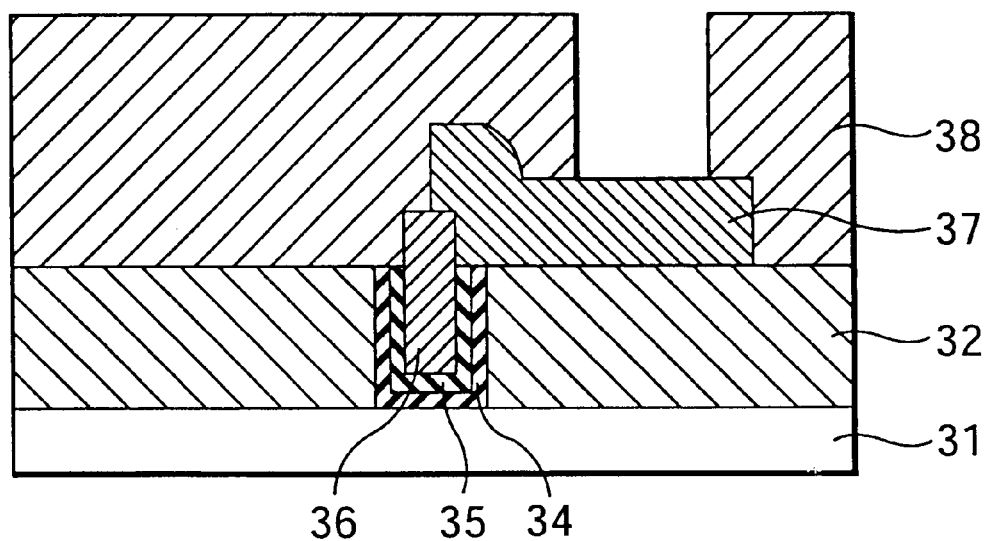

Then, as illustrated in FIG. 6(b), an aluminum alloy 19 is formed by high-temperature sputtering as according to the second embodiment, to fill in the groove for the second aluminum wiring. The aluminum alloy 19 is then polished by CMP until the surface of the silicon oxide film 19 is exposed, to form the second aluminum wiring 20, as illustrated in FIG. 6(c).

Since the interlayer insulation films used are a silicon oxide film and a silicon oxy-fluoride film which have relatively low dielectric constants as compared with silicon nitride films, the third embodiment has the advantage of having lower wiring capacity.

The aluminum alloy, though being formed by high-temperature sputtering according to all the above embodiments, may be prepared otherwise, by CVD, for example, to fill in the wiring grooves. The wiring material may of course be other than aluminum alloys, for example, copper or aluminum-copper alloys. The refractory metal pillar may be formed by materials other than tungsten, for example, W alloys, Mo, Ti, Co, Ta or their respective alloys.

While the present invention has been described in connection with certain preferred embodiments, it is to be understood that the subject matter encompassed by way of the present invention is not to be limited to those specific embodiments. On the contrary it is intended for the subject matter of the invention to include all alternatives, modifications and equivalents as can be included within the spirit and scope of the following claims.

What is claimed is:

1. A method for fabricating a semiconductor device, said method comprising the steps of:

forming a first insulation film on a first wiring layer formed on a semiconductor substrate;

forming a second insulation film on said first insulation film;

forming a third insulation film on said second insulation film;

forming a hole through said first, second and third insulation films to expose said first wiring layer at its bottom;

forming a refractory metal pillar structure by filling in said hole with a refractory metal;

forming a fourth insulation film to cover exposed surfaces of said pillar structure and said third insulation film;

selectively removing portions of said third and fourth insulation films to form an opening exposing a side and a top surface of said refractory metal pillar structure; and filling in said opening with a conductive wiring material to form a second wiring layer to electrically connect with said refractory metal pillar.

2. The method for fabricating a semiconductor device as claimed in claim 1, wherein the film thickness of said third insulation film is ⅓ to ⅔ times the film thickness of said second wiring layer.

3. The method for fabricating a semiconductor device as claimed in claim 1, wherein the film thickness of said third insulation film is ⅓ to ⅔ times the film thickness of said second wiring layer, and the film thickness of said second insulation film is 10–30 nm.

4. The method for fabricating a semiconductor device as claimed in claim 1, wherein said third insulation film is silicon oxide having a film thickness of ⅓ to ⅔ times the film thickness of said second wiring layer, and said second insulation film is silicon nitride having a film thickness of 10–30 nm.

5. The method for fabricating a semiconductor device as claimed in claim 1, wherein said third insulation film is etched with a higher etch rate than said second insulation film so that said second insulation film is used as an etching stopper film in said selective removing step.

6. The method for fabricating a semiconductor device as claimed in claim 1, wherein the film thickness of said third insulation film is ⅓ to ⅔ times the film thickness of said second wiring layer, and said third insulation film is etched with a higher etch rate than said second insulation film so that said second insulation film is used as an etching stopper film in said selective removing step.

7. The method for fabricating a semiconductor device as claimed in claim 1, wherein the film thickness of said third insulation film is ⅓ to ⅔ times the film thickness of said second wiring layer, the film thickness of said second insulation film is 10–30 nm, wherein said third insulation film is etched with a higher etch rate than said second insulation film so that said second insulation film is used as an etching stopper film in said selective removing step.

8. The method for fabricating a semiconductor device as claimed in claim 1, wherein said second wiring layer is provided by depositing a wiring metal on an area containing said opening and thereafter subjecting said wiring metal to surface polishing to remove said wiring metal outside said opening.

9. The method for fabricating a semiconductor device as claimed in claim 1, wherein the film thickness of said third insulation film is ⅓ to ⅔ times the film thickness of said second wiring layer, and said second wiring layer is provided by depositing a wiring metal on an area containing said opening and thereafter subjecting said wiring metal to surface polishing to remove said wiring metal outside said opening.

10. The method for fabricating a semiconductor device as claimed in claim 1, wherein the film thickness of said third insulation film is ⅓ to ⅔ times the film thickness of said second wiring layer, and the film thickness of said second insulation film is 10–30 nm, wherein said second wiring layer is provided by depositing a wiring metal on an area containing said opening and thereafter subjecting said wiring metal to surface polishing to remove said wiring metal outside said opening.

11. The method for fabricating a semiconductor device as claimed in claim 1, wherein said refractory metal is tungsten, and said wiring material is an aluminum alloy.

12. The method for fabricating a semiconductor device as claimed in claim 1, wherein said refractory metal pillar comprises a laminated structure of titanium, titanium nitride, and tungsten successively filled in said hole, and said wiring material is an aluminum alloy.

13. The method for fabricating a semiconductor device as claimed in claim 1, wherein said selective removing step partially exposes said side surface and said top surface of said refractory metal pillar.

14. A method for fabricating a semiconductor device, said method comprising the steps of:

forming a first insulation film on a first wiring layer formed on a semiconductor substrate;

forming a second insulation film to a predetermined thickness on said first insulation film;

forming a hole through said first and second insulation films to expose said first wiring layer at its bottom;

forming a refractory metal pillar structure by filling in said hole with a refractory metal;

forming a third insulation film to cover exposed surfaces of said pillar structure and said second insulation film;

selectively removing portions of said second and third insulation films to form an opening exposing a side and a top surface of said refractory metal pillar structure, wherein a height of said side of said pillar exposed is made substantially equal to said predetermined thickness by etching said second insulation film with a higher etch rate than said first insulation film so that said first insulation film is used as an etching stopper film; and filling in said opening with a conductive wiring material to form a second wiring layer to electrically connect with said refractory metal pillar.

15. The method for fabricating a semiconductor device as claimed in claim 14, wherein the film thickness of said second insulation film is ⅓ to ⅔ times the film thickness of said second wiring layer.

16. The method for fabricating a semiconductor device as claimed in claim 14, wherein the film thickness of said second insulation film is ⅓ to ⅔ times the film thickness of said second wiring layer, and said second insulation film is etched with a higher etch rate than said first insulation film so that said first insulation film is used as an etching stopper film in said selective removing step.

17. The method for fabricating a semiconductor device as claimed in claim 14, wherein said second insulation film is silicon nitride having a film thickness ⅓ to ⅔ times the film thickness of said second wiring layer, and said first insulation film is silicon oxide being etched with a lower etch rate than said second insulation film so that said first insulation film is used as an etching stopper film in said selective removing step.

18. The method for fabricating a semiconductor device as claimed in claim 14, wherein said second insulation film is silicon oxy-fluoride having a film thickness of ⅓ to ⅔ times the film thickness of said second wiring layer, and said first insulation film is silicon oxide being etched with a lower etch rate than said first insulation film so that said second insulation film is used as an etching stopper film in said selective removing step.

19. The method for fabricating a semiconductor device as claimed in claim 14, wherein the second wiring layer is provided by depositing a wiring metal on an area containing said opening and thereafter subjecting said wiring metal to surface polishing to remove said wiring metal outside said opening.

20. The method for fabricating a semiconductor device as claimed in claim 14, wherein said refractory metal pillar comprises a laminated structure of titanium, titanium nitride, and tungsten successively filled in said hole, and said wiring material is an aluminum alloy.

21. The method for fabricating a semiconductor device as claimed in claim 14, wherein said selective removing step partially exposes said side surface and said top surface of said refractory metal pillar.

22. A method for fabricating a semiconductor device, said method comprising the steps of:

forming a first insulation film on a first wiring layer formed on a semiconductor substrate;

forming a second insulation film to a predetermined thickness on said first insulation film;

forming a hole through said first and second insulation films to expose said first wiring layer at its bottom;

forming a refractory metal pillar structure by filling in said hole with a refractory metal;

forming a third insulation film to cover exposed surfaces of said pillar structure and said second insulation film;

selectively removing a portion of said third insulation film to form an opening exposing a top surface of said refractory metal pillar structure and a surface of said second insulation film adjacent to said top surface of said refractory metal pillar structure using a first etchant;

selectively removing a portion of said second insulation film exposed by said first etchant to form an opening exposing a side surface of said refractory metal pillar structure using a second etchant different from said first etchant, wherein a height of said side of said pillar exposed is made substantially equal to said predetermined thickness by etching said second insulation film with a higher etch rate than said first insulation film so that said first insulation film is used as an etching stopper film; and filling in said opening with a conductive wiring material to form a second wiring layer.

* * * * *